United States Patent [19]

Panousis et al.

[11] 4,055,802
[45] Oct. 25, 1977

[54] ELECTRICAL IDENTIFICATION OF MULTIPLY CONFIGURABLE CIRCUIT ARRAY

[75] Inventors: Peter Theodore Panousis, Allentown; Robert Leonard Pritchett, Bath; Friedolf Michael Smits, Allentown, all of Pa.

[73] Assignee: Bell Telephone Laboratories, Incorporated, Murray Hill, N.J.

[21] Appl. No.: 713,910

[22] Filed: Aug. 12, 1976

[51] Int. Cl.$^2$ .................. G01R 15/12; G01R 31/30
[52] U.S. Cl. .......................... 324/73 AT; 364/490; 235/302.3
[58] Field of Search .......... 324/73 AT, 73 R, 73 PC; 235/153 AC; 340/173

[56] References Cited

U.S. PATENT DOCUMENTS

| | | | |
|---|---|---|---|
| 3,737,859 | 6/1973 | Kadow | 324/73 PC X |
| 3,761,695 | 9/1973 | Eichelberger | 235/153 AC |
| 3,784,907 | 1/1974 | Eichelberger | 324/73 AT X |
| 3,872,441 | 3/1975 | Cailow | 324/73 X |
| 3,969,618 | 7/1976 | Strudel et al. | 235/153 AC |

Primary Examiner—Rudolph V. Rolinec
Assistant Examiner—Vincent J. Sunderdick
Attorney, Agent, or Firm—Lucian C. Canepa

[57] ABSTRACT

For identification purposes, a network is added to a multiply configurable microminiature array. During fabrication of the array, the connection pattern of the network is established to be uniquely representative of the particular circuit then being formed in the array. In response to interrogation signals applied to the array, the network provides a unique pattern of voltages representative of the particular circuit. During actual operation of the array, the identification network is in effect automatically disconnected therefrom.

8 Claims, 2 Drawing Figures

ELECTRICAL IDENTIFICATION OF MULTIPLY CONFIGURABLE CIRCUIT ARRAY

BACKGROUND OF THE INVENTION

This invention relates to the fabrication of circuit arrays and, more particularly, to a technique for electrical identification of the circuit configuration formed in a multiply configurable circuit array.

A general-purpose integrated-circuit array such as a read-only memory is programmed during fabrication (by utilizing different masks) to establish therein a particular multiple-word representation specified by a user. In practice, such a general-purpose array may be made in hundreds of different variations or codes to respectively store hundreds of different representations. Keeping track of such a large number of almost visually indistinguishable but electrically different integrated-circuit chips during the manufacturing process is a burdensome and expensive task.

Hence, the need arose for some way of easily determining the code of a mask-programmed array so that the array could be tested and later sorted for marking without having to maintain records of the identity of the code during the entire manufacturing process.

SUMMARY OF THE INVENTION

Accordingly, an object of the present invention is to facilitate the fabrication of multiply configurable circuit arrays.

More specifically, an object of this invention is a technique for providing electrical identification of the circuit configuration formed in such an array.

Briefly, these and other objects of the present invention are realized in a specific illustrative embodiment thereof in which an identification network is formed on an integrated-circuit chip during fabrication of a multiply configurable circuit array. The connection pattern of the network is formed to be uniquely representative of the particular configuration then being embodied in the array. Subsequently, for example during testing and sorting of plural differently coded chips, a chip is identified by applying electrical interrogation signals to the input leads of the array. In response to such signals, a unique pattern of voltages representative of the chip code appears on the input (and/or output) leads. When power is applied to the chip during actual operation of the circuit array, the network is in effect automatically disconnected from the input leads of the array. Accordingly, the identification network is "transparent" to a user of the array, that is, the presence on the chip of the identification network is not apparent to a user. In accordance with other aspects of the invention, however, other identification techniques, some of which are not transparent to a user, are employed. In any case the use of such techniques removes the necessity for physically marking or otherwise keeping track of the chip codes during the entire manufacturing process. Advantageously, physical marking is deferred until the chips are packaged and determined to be error-free.

BRIEF DESCRIPTION OF THE DRAWING

A complete understanding of the present invention and of the above and other objects, features and advantages thereof may be gained from a consideration of the following detailed description presented hereinbelow in connection with the accompanying drawing, in which.

DETAILED DESCRIPTION

The principles of the present invention are applicable to a variety of multiply configurable circuit arrays. For purposes of a specific example, one particular illustrative such array 10 is schematically represented within dashed lines in FIG. 1. This known array is a so-called read-only memory (ROM) unit. The unit 10 comprises a matrix array 12 that includes multiple horizontal and vertical conductors that define non-contacting intersections. As is well known, these intersections may be grouped to be representative of multiple plural-bit words. The make-up of each word is determined by whether or not a device such as a transistor or diode is connected between the orthogonal conductors definitive of each intersection. Thus the presence of a device at an intersection may represent a "1" indication and the absence of a device may represent a "0" or vice versa. By utilizing either format, any user-specified representation of multiple plural-bit words may be established in the depicted unit.

By way of a particular illustrative example, it is assumed that the matrix array 12 of the ROM unit 10 comprises 16,384 intersections organized in a conventional way to be representative of 2,048 8-bit words. Hence the unit 10 is commonly designated a 16K ROM.

Figure 1:
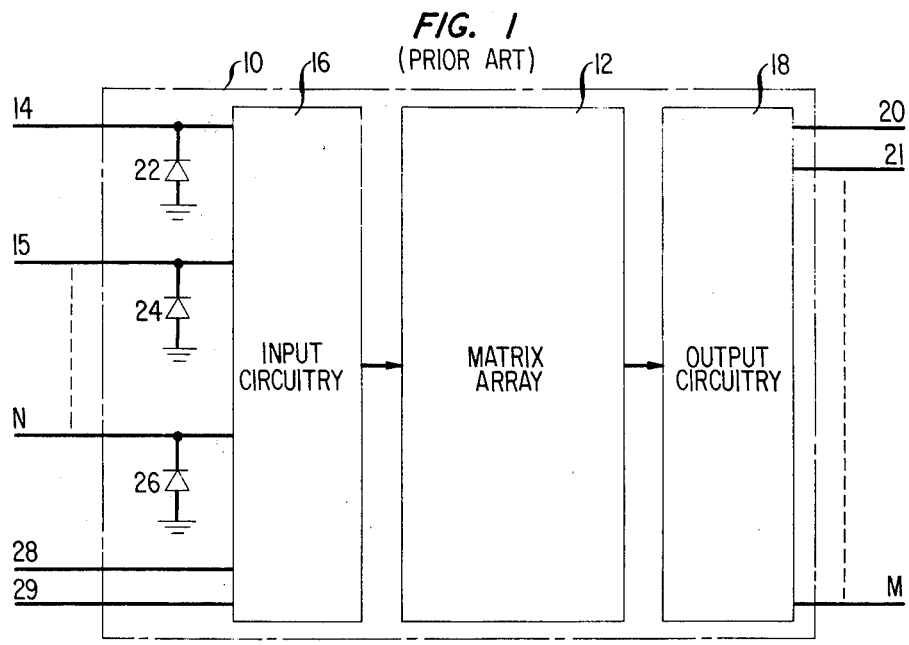
FIG. 1 shows a prior art circuit array.

In a manner well known in the art, any specified one of the 2,048 words stored in the matrix array 12 of FIG. 1 may be addressed by applying to the unit 10 a corresponding 11-bit address word. The respective digits of such an address word are aplied to input conductors 14, 15 ... N. In response to such an applied word, input circuitry 16, which comprises conventional buffers, decoders and drivers, selects a particular 8-bit word stored in the matrix array 12. In turn, the bits of the selected word are respectively applied via standard output circuitry 18 to output conductors 20, 21 ... M.

Additional inputs known as chip-select inputs (not shown in FIG. 1) may also be provided to select a particular ROM unit out of several such units. These additional inputs may be treated exactly like the address inputs 14, 15 ... N for purposes of circuit identification. (Alternatively, chip selection may be achieved by applying enabling signals to the output circuitry 18.)

Microminiature versions of the unit 10 of FIG. 1 have been constructed in integrated circuit form utilizing the known logic technology designated transistor-transistor logic (TTL). In such a TTL embodiment, it is customary to connect a clamping diode between each input conductor and a point of reference potential (such as ground). Three such input diodes 22, 24 and 26 are shown in FIG. 1. These diodes are typically each constructed as a transistor with the base and collector terminals connected together.

Two additional input conductors 28 and 29, which serves as power supply leads to the unit 10, are shown in FIG. 1. The conductor 29 is intended to be connected to a point of reference potential (such as ground), and the conductor 28 is intended to be connected to a voltage having a specified value (for example, +5 volts) with respect to ground.

An ROM unit 10 such as the one represented in FIG. 1 is a general-purpose configuration applicable for use as a basic component in a variety of systems. In practice, hundreds of different memory formats may be specified by users to be respectively stored in the matrix arrays of the units. Typically, each such format is embodied in a unit during the fabrication thereof by connecting or not connecting a device such as a transistor or diode at each of the defined intersections of the matrix array. If such a unit is made in integrated-circuit form, a coded mask definitive of the user-specified storage format in the matrix array is prepared. By means of the mask, a semiconductor wafer is then processed in a standard way to form thereon multiple chips each comprising an ROM unit having a specified pattern of devices at the multiple intersections of the matrix array thereof.

A particularly advantageous apparatus with which to form the aforementioned coded masks is described in U.S. Pat. No. 3,900,737, issued Aug. 19, 1975 to R. J. Collier and D. R. Herriott, entitled "Electron Beam Exposure System". With such a computer-controlled system it is feasible to form a single master mask structure that includes thereon plural differently coded masks. In processing an associated wafer with such a master mask to fabricate multiple chips each including an ROM unit, plural different memory codes may be embodied in the chips during a single batch fabrication procedure. Alternatively, such a computer-controlled system may be employed to directly process a wafer to fabricate thereon multiple identical or different ROM units.

Thus, a given wafer may contain either multiple identical ROM units or a number of differently coded ROM units. In a practical production environment where a number of wafers are being processed, it is apparent that the task of maintaining records that establish an absolute correspondence between a particular chip and its code designation is tedious, exacting and expensive. (Physical marking of microminiature chips during the early stages of their fabrication is typically not feasible.)

In accordance with one aspect of the principles of the present invention, each circuit array of the type described above is configured during fabrication to include an identification network. The network in each circuit array is constituted by design to be a unique identifier of the particular memory format established in the matrix array of the ROM unit.

Figure 2:
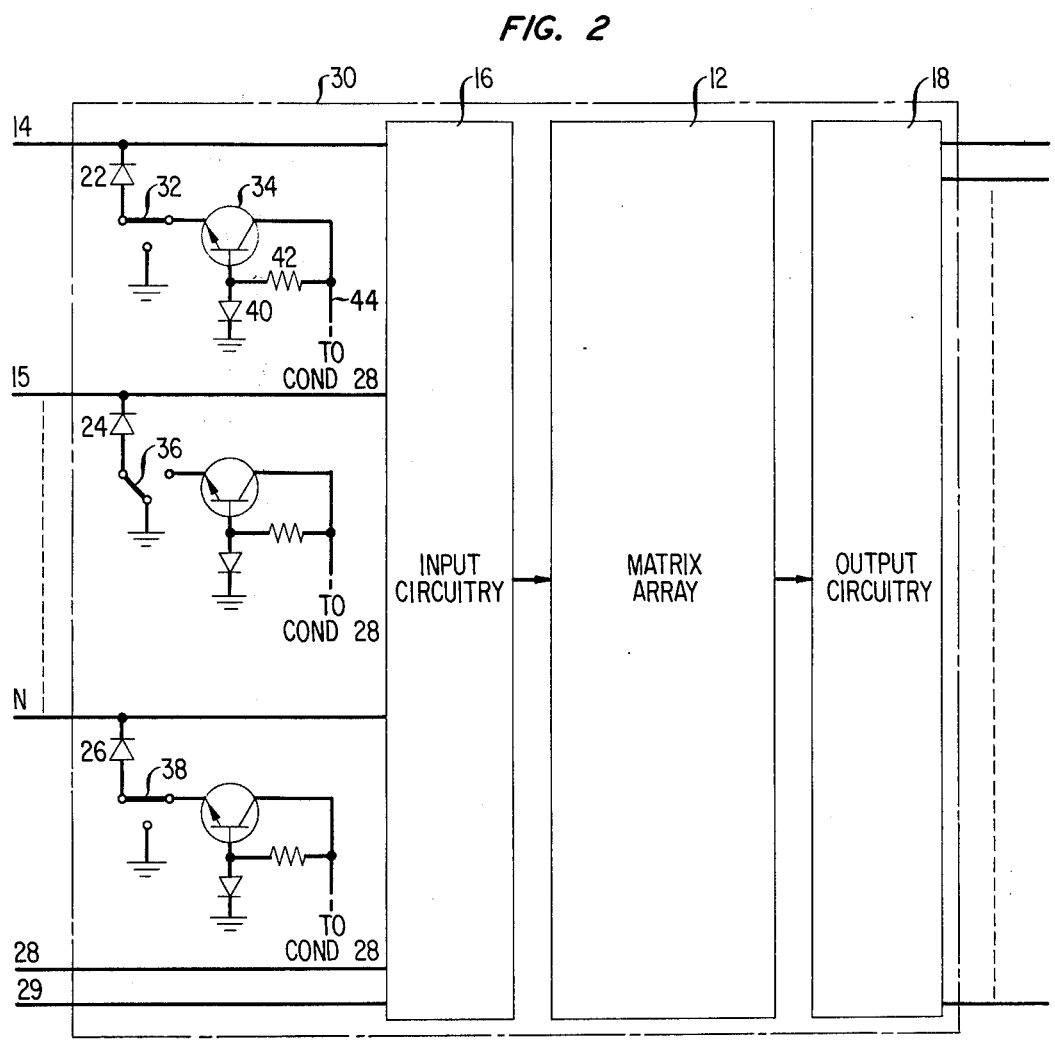
FIG. 2 is a representative depiction of a specific illustrative circuit array made in accordance with the principles of the present invention.

FIG. 2 shows a general-purpose circuit array 30 including a specific illustrative identification network made in accordance with the principles of the present invention. Again, for purposes of a specific illustrative example, the array 30 will be assumed to be an ROM unit. In addition, the input and output circuitry and the matrix array included in the unit 30 are assumed to be identical to the corresponding components included in the unit 10 shown in FIG. 1. Hence the reference numerals employed in FIG. 1 for these components are also utilized in FIG. 2. Further, all the input and output conductors are identically designated in FIGS. 1 and 2.

The unit 30 of FIG. 2 also includes clamping diodes and these too are designated with the same reference numerals employed therefor in FIG. 1. As in FIG. 1, one electrode (for example the cathode) of each of the clamping diodes 22, 24 and 26 of FIG. 2 is connected directly to a respective one of the input conductors 14, 15 ... N. But, in accordance with one aspect of the principles of the present invention, the other electrode of each of the diodes 22, 24 and 26 is programmed during fabrication of the unit 30 to be connected either directly to ground or to the emitter electrode of an associated transistor. The first type of connection (directly to ground) may, for example, be considered representative of a "0" indication whereas the second-mentioned connection may be taken to represent a "1". Employing that particular convention, it is apparent that the diodes 22, 24 and 26 of FIG. 2 are connected to represent "1", "0" and "1", respectively. And, if the unit 30 includes eleven such diode-clamped input conductors, it is evident that an 11-bit identification word may be formed during fabrication of the unit 30 by selectively connecting each diode either to ground or to its associated identification network.

In FIG. 2 the anode electrode of the diode 22 is electrically connected via a link 32 to the emitter electrode of a transistor 34. The link 32 is intended to represent a metallic connection established in an integrated-circuit chip during fabrication of a semi-conductor wafer. This link may, for example, be selectively programmed on the metal-interconnection level of the semiconductor wafer or, more commonly, electrical connection to the link may be programmed by selectively opening contact windows between a standard metalized pad and the appropriate circuit element. The links 36 and 38 are similarly fabricated.

In the manner described above, an 11-bit identification word may be formed in the input network included on each chip. Formation of the identification word is designed to occur during fabrication of the chip and is controlled to be uniquely representative of the particular memory configuration being formed in the matrix array 30. Each different memory configuration embodied in the array 30 is designed to have associated therewith a different identification word. By specifying this word to a computer-controlled mask-making facility, a master mask is formed which is then utilized to impose a specified connection pattern in the input identification network of each wafer chip to be made with the mask.

As stated earlier above, the emitter electrode of the transistor 34 is connected via the link 32 to the anode of the diode 22. The base electrode of the transistor 34 is connected via a diode 40 to ground and is also connected via a resistor 42 to the collector electrode of the transistor. Additionally, the collector electrode is directly connected by lead 44 to the power supply input conductor 28. Illustratively, each of the transistor arrangements shown in FIG. 2 is identical to the aforedescribed one associated with the input conductor 14.

In FIG. 2, an individual transistor arrangement is shown associated with each of the input conductors 14, 15 ... N. Alternatively, in some embodiments of practical interest, a single such transistor arrangement suffices to serve as an identification network made in accordance with the principles of the present invention. In that case, the emitter electrode of a single transistor is connected to the anodes of selected ones of the input clamping diodes. Or individual transistors may be respectively associated with the input conductors, as shown in FIG. 2, but the base and collector electrodes of each such transistor may be connected to a single shared pair of components such as the diode 40 and the resistor 42.

Assume that multiple units, each of the type represented in FIG. 2, have been fabricated on a single semiconductor wafer. Further, assume that such units have been made to have embodied in the matrix arrays thereof plural different memory formats and that an identification network made in accordance with the principles of this invention has been formed on each unit to uniquely represent the corresponding memory format. To test these units by conventional wafer probing techniques, it is first necessary to identify the format or code embodied in each chip. In accordance with the present invention, this identification is done in a simple and reliable way with no associated record-keeping required.

To electrically identify the format of each FIG. 2-type unit, the input power supply lead 28 of the unit is first connected to ground. As a result, each of the depicted collector-grounded transistor arrangements is in effect connected as a base-to-emitter junction diode. Thus, in those cases in which the emitter electrode of a transistor is connected to the anode of its associated clamping diode, two series-aiding diodes are connected between ground and the corresponding input conductor. Accordingly, if interrogation signals are respectively applied to the input conductors to force current flow from right to left therein, a voltage equal to about two diode drops (approximately $-1.4$ volts) is established on each input conductor to which two such series-aiding diodes are connected. For those input conductors whose clamping diodes are not connected to the associated transistor arrangements (for example, the conductor 15 in FIG. 2) a voltage equal to a single diode drop (approximately $-0.7$ volts) is established. Hence, if $-1.4$ volts is representative of a "1" and $-0.7$ volts signifies a "0", it is apparent that the plural-bit pattern of signals detected on the input conductors during the interrogation process corresponds to the unique representation formed in the identification network during fabrication of the unit.

During testing (or later during actual operation) of a unit of the type shown in FIG. 2, the power supply lead 28 is connected to a voltage having a specified value (for example, $+5$ volts) with respect to ground. Accordingly, the collector electrode of each transistor included in the identification network depicted in FIG. 2 is also connected to $+5$ volts. As a result, the base-connected diode of each transistor (for example the diode 40) establishes the base electrode one diode drop above ground. Accordingly, whenever the clamping diode 22 and the transistor 34 are rendered conductive, the emitter electrode of the transistor is in effect established at ground potential. (Tracing a path from the emitter electrode of the transistor 34 to the grounded cathode of the diode 40, it is seen that the base-to-emitter junction diode of the transistor 34 and the diode 40 are connected in series opposition.) As a result, the clamping action of each diode having its anode connected to an associated transistor arrangement is essentially the same as the action of a diode having its anode connected directly to ground. In either case, an activated clamping diode establishes in associated input conductor at approximately $-0.7$ volts. Hence, neither during testing nor during actual use is the operation of the unit affected by the presence of the herein-considered identification circuitry.

In one specific illustrative embodiment of the unit 30 represented in FIG. 2, an internal reference voltage chain includes series-connected resistors and diodes. Advantageously, these same series-connected elements are utilized to form the resistor-diode networks (for example the elements 40 and 42) included in the transistor arrangements shown in FIG. 2. In addition, the collector leads (for example the lead 44) shown in FIG. 2 may be connected to any available reference voltage in the unit 30 whose value is normally greater than one diode drop and whose value goes to ground potential whenever the voltage applied to the input lead 28 goes to ground potential.

In an automated testing facility, the aforementioned electrical interrogation procedure is effective to identify the particular format embodied in a unit. In turn, this may, for example, serve as the basis for calling from a program library a truth table representative of the particular format in the unit. Testing involves systematically addressing the unit by sequentially applying input words thereto. Each output word thereby actually obtained from the unit is compared with the corresponding entry in the truth table. Any discrepancy therebetween indicates an error condition in the unit under test.

Subsequently, error-free units are separated from the wafer and individually packaged. During these steps, neither physical code markings on the units nor associated written records of the respective identities of the various units need be employed. In practice, this greatly simplifies this phase of the overall manufacturing process.

After being packaged, each unit made in accordance with the principles of this invention is electrically interrogated in the manner described earlier above to identify the particular code format embodied therein. Then again by reference to a standard truth table representative of the particular code, the packaged unit is retested. At that point, each unit that is determined to be error-free is for the first time physically marked with code indicia.

Thus, in accordance with one aspect of the principles of this invention, a multiply configurable circuit array includes a unique network that can be electrically interrogated to identify the particular configuration embodied in the array. The task of keeping track of differently coded arrays during manufacture thereof is thereby greatly facilitated. During normal operating conditions, the particular identification network specified above is transparent to a user of the array.

But, although primary emphasis herein has been directed to a particular transparent network included in a circuit array for electrical interrogation purposes, it is to be understood that other networks that are not in effect disconnected during actual operation of the array may also be utilized for identification purposes. Thus, for example, one might provide a clamping network comprising either one or two diodes associated with each input (or output) lead of the array. Such a pattern of clamping networks can be designed to respond to electrical interrogation signals to provide a unique indication of the configuration or code of the array.

Alternatively, one can simply connect or not connect a clamping network (for example a single diode) to each input (or output) lead of the array to form a basis for unique identification of the array by electrical interrogation. This technique too is, of course, not transparent to a user of the array.

Further, it should be realized that one can simply reserve some of the internal storage capacity of an ROM unit for identification purposes. In other words, some of the regular addresses within the storage array of the unit can be used for identifying a given code. This identification technique, which of course is also not transparent to a user of the unit, is a feasible alternative in some cases of practical interest.

Moreover, with some programming effort one can make the identification process totally transparent to the user without the necessity for any additional circuitry. Different ROM units are indeed different and thus, if one makes a software search in the truth table of a given batch of such units, one can identify a limited number of addresses that contain information unique to the individual units within the batch. Thus, reading those selected addresses first provides a data pattern that will uniquely identify an individual code.

Hence, in accordance with another aspect of the principles of the present invention, the aforementioned or related identification techniques, whether they are transparent or not, remove the requirement for physically marking or otherwise keeping track of the chip codes during the entire fabrication cycle. Advantageously, physical marking is deferred until the chips are finally packaged and determined to be error-free.

It is to be understood that the above-described arrangements and techniques are only illustrative of the application of the principles of the present invention. In accordance with those principles, numerous other arrangements may be devised by those skilled in the art without departing from the spirit and scope of the invention.

What is claimed is:

1. A method adapted to be utilized in the fabrication of a multicode batch of almost visually indistinguishable but electrically different programmable integrated-circuit chips to make it unnecessary initially to physically mark the chips or to maintain records of the identity of each chip code, said method comprising the steps of
   applying electrical interrogation signals to each physically unmarked but already programmed chip to determine the code thereof,
   applying electrical test signals to each physically unmarked but already programmed chip in accordance with a unique testing program that respectively corresponds to the identification code of the chip,
   and comparing the output signals obtained from each physically unmarked but already programmed chip in response to said test signals with a standard set of output signals to determine the error condition of the chip.

2. A method as in claim 1 further including the steps of
   packaging each physically unmarked but already programmed chip that is determined to be error-free,
   applying electrical interrogation signals to each physically unmarked packaged chip to determine the code thereof,
   applying electrical test signals to each packaged chip in accordance with the unique testing program that respectively corresponds to the identification code of the packaged chip,
   comparing the output signals obtained from each packaged chip in response to said test signals with a standard set of output signals to determine the error condition of the packaged chip,
   and, for the first time in the fabrication process, physically marking each error-free packaged chip with its respective code indicia.

3. In a multiply configurable integrated circuit chip
   plural input signal conductors and a bias voltage conductor,
   and identification circuit means on said chip connected to said bias voltage conductor and to selected ones of said input signal conductors in a connection pattern that is uniquely representative of the configuration established in said integrated circuit, said circuit means being formed on said chip during fabrication thereof to serve as a permanent identifier of the particular configuration programmed into said integrated circuit, said circuit means being responsive to said bias voltage conductor being connected to a point of reference potential for appearing to signals applied to said input signal conductors to be connected in said unique connection pattern but being responsive to said bias voltage conductor being connected to a specified bias voltage for appearing to signals applied to said input signal conductors to constitute in effect the same circuit configuration connected between each selected input signal conductor and said point of reference potential as is connected between each nonselected input signal conductor and said point of reference potential.

4. A general-purpose circuit comprising
   plural input signal conductors and a bias voltage conductor,
   a configurable array,
   means connected to said conductors for applying signals to said array,
   and identification means, configured during fabrication of said circuit to be uniquely representative of the configuration of said array, connected to said conductors and responsive to said bias voltage conductor being connected to a point of reference potential and to the application of interrogation signals of a specified polarity to said input signal conductors for establishing on said input signal conductors a plural-digit binary representation determined by the configuration of said identification means and responsive to said bias voltage conductor being connected to a prescribed bias voltage for respectively establishing on said inut signal conductors identical voltages in response to applied signals of said specified polarity.

5. A circuit as in claim 4 wherein said array comprises a programmable read-only memory unit.

6. A circuit as in claim 5 wherein said applying means includes plural clamping diodes each having one electrode thereof connected to a different one of said input signal conductors,
   and wherein said identification means includes circuitry connected to the other electrodes of selected ones of said diodes, said circuitry being connected to said bias voltage conductor and being responsive to the application to said conductor of said prescribed bias voltage for in effect establishing the other electrodes of said selected diodes at said point of reference potential but being responsive to the application to said bias voltage conductor of said reference potential for connecting a diode in series aiding with each selected diode,
   and means directly connecting the other electrodes of the nonselected ones of said diodes to said point of reference potential.

7. A general-purpose n-input integrated circuit array designed to be fabricated in the form of a microminiature chip that is programmed during fabrication to form a specified one of multiple different circuit configurations, said array also including a power supply input lead that is intended to be connected during actual operation of said circuit array to a specified voltage having a predetermined value with respect to a point of reference potential, said array including $n$ clamping diodes on said chip, each diode having one electrode thereof connected to a different one of the $n$ inputs of said array;

$n$ networks on said chip respectively associated with said $n$ inputs;

means programmable during fabrication of said chip for connecting the other electrode of each diode either to said point of reference potential or to the associated network to establish a pattern of connections representative of a specified one of multiple different circuit configurations established in said array;

and means on said chip connecting said power supply input lead to said networks;

said networks being responsive, when said power supply input lead is connected to said point of reference potential, to interrogation signals respectively applied to said $n$ inputs for providing at each different input a first standard voltage if the other electrode of the clamping diode is connected to said point of reference potential and a second standard voltage if the other electrode is connected to said associated network whereby the pattern of said programmed connections is ascertained during interrogation of said inputs;

said networks being effective, when said power supply input lead is connected to said specified voltage during actual operation of said array, to connect the other electrodes of the diodes connected to said networks to said point of reference potential whereby said networks are in effect not included in said array during actual operation thereof.

8. An array as in claim 7 wherein each of said networks comprises a transistor having base, emitter and collector electrodes, said emitter electrode being adapted to be connected or not via said programmable connecting means to the other electrode of the associated clamping diode, a diode connected between said base electrode and said point of reference potential, a resistor connected between said base and collector electrodes, and a direct electrical connection between said collector electrode and said power supply input lead.

* * * * *